(12) United States Patent
Xavier et al.

(10) Patent No.: US 6,190,748 B1
(45) Date of Patent: Feb. 20, 2001

(54) OPTICAL DISCS

(75) Inventors: Miguel Nunes Xavier, West Sussex (GB); Martin John Goldman, Albi (FR)

(73) Assignee: Disctronics Manufacturing, West Sussex (GB)

( * ) Notice: Under 35 U.S.C. 154(b), the term of this patent shall be extended for 0 days.

(21) Appl. No.: 09/093,973

(22) Filed: Jun. 9, 1998

(30) Foreign Application Priority Data

Jun. 9, 1997 (GB) .................................................... 9711947

(51) Int. Cl.[7] ........................................................ B32B 3/02
(52) U.S. Cl. ....................... 428/64.1; 428/64.2; 428/64.4; 428/913; 430/270.11; 430/321; 430/328; 430/945; 369/275.1
(58) Field of Search ................................ 428/64.1, 64.2, 428/64.4, 913; 430/270.11, 321, 326, 495.1, 945, 328; 369/275.1, 283, 288

(56) References Cited

U.S. PATENT DOCUMENTS

| | | | |
|---|---|---|---|
| 5,607,188 | * | 3/1997 | Bahn ..................................... 283/113 |
| 5,608,718 | * | 3/1997 | Schiewe ............................. 369/275.4 |
| 5,645,978 | * | 7/1997 | Inui et al. ............................. 430/321 |
| 5,766,495 | * | 6/1998 | Parette ................................... 216/54 |
| 5,843,626 | * | 12/1998 | Ohta et al. ........................... 430/320 |

* cited by examiner

Primary Examiner—Elizabeth Evans
(74) Attorney, Agent, or Firm—Lyon & Lyon LLP

(57) ABSTRACT

A method of manufacturing an optical disc master includes preparing the surface of a glass master plate (2) with an adhesion promoter 4. A photoresist layer (6) is coated on the adhesion promoter (4). This photoresist layer (6) is subjected to a first exposure of a modulated laser beam (8) to produce an exposed photoresist layer (10) corresponding to the modulation information of the laser beam (8).

A transparent sheet (16) is placed on the photoresist layer (6). This sheet (16) contains a distinguishing mark to be located in the optical disc. White light (18) from a second light source is passed through the sheet (16) onto the photoresist layer (6) to expose the upper surface of this layer (6). The exposed part of this upper surface provides a pattern (22) corresponding to the mark on the sheet (16).

The exposed master plate (2) is then developed to form the pits (12) and a reproduction (24) of the pattern (22).

19 Claims, 3 Drawing Sheets

OPTICAL DISCS

The present invention relates to a method of manufacturing optical discs. By "optical disc" is meant a disc in which the required information is recorded on, and played back from, the disc by optical means.

In a conventional method of manufacturing an optical disc the upper surface of a glass master plate is prepared using a suitable adhesion promoter. This prepared surface is then coated with a thin layer of a photoresist. The intensity of a laser beam is modulated in accordance with the information to be recorded on the disc, and the laser beam is focused on the photoresist layer. The master is rotated and the laser beam commences the recording session at the centre of the disc and moves radially outwardly to produce a spiral pattern of exposed photoresist in the photoresist layer. The depth of the exposed pattern will be proportional to the intensity of the focused laser beam. Because the laser beam is modulated digitally this means that the spiral pattern will either have a depth of 0 or 1, where 0 corresponds to the upper surface of the photoresist layer and 1 corresponds to the lower surface of the photoresist layer.

On developing the photoresist layer the exposed parts of the photoresist dissolve, and these dissolved parts of the photoresist layer are washed away to leave pits which provide in digital form information corresponding to the information source used to modulate the laser beam.

A layer of sputtered nickel or evaporated silver is formed on the surface of the developed master containing the pits, a nickel father is formed from the master, a mother is formed from the father, and a stamper is formed from the mother, in accordance with conventional known methods of manufacturing optical discs.

A plastic polycarbonate optical disc is injection moulded from the stamper, a reflective metallic layer is placed on the surface of the disc containing the pits, and a layer of curable lacquer is placed on the aluminium layer. A label providing the desired information on the contents of the disc is then imprinted on the now cured surface of the lacquer layer.

It is an aim of the invention to provide a distinguishing mark beneath a surface of the optical disc.

In this specification the term "distinguishing mark" covers a mark of any desired visual content such as for example an illustration, a logo, written matter or any combination of these.

According to the present invention there is provided a method of manufacturing an optical disc master comprising the preparation of the surface of a glass master plate to receive a layer of photoresist, applying the said layer of photoresist, subjecting the photoresist layer to a first exposure of a modulated laser beam to produce an exposed first pattern corresponding to the information used to modulate the laser beam, locating a distinguishing mark in the path of light from a second light source directed onto the previously exposed surface of the photoresist layer to locate thereon an exposed second pattern corresponding to said distinguishing mark.

In the subsequent development stage of manufacturing the optical disc master, the distinguishing mark is developed to the same parameter as is required to develop the laser exposed first pattern. As the distinguishing mark is now contained within the glass master, during the known production sequence of a glass master through to a production stamper and onto subsequent disc replication, the distinguishing mark is transferred onto the polycarbonate replica along with the laser exposed first pattern. Both images are subsequently coated with a metallic layer and then a protective lacquer layer. Thus resulting in a mark that cannot be readily erased or removed from the disc.

The distinguishing mark may be contained in a transparent sheet which may be placed in contact with the surface of the photoresist receiving the said light.

In one embodiment of the invention the photoresist layer is exposed twice to the source light. The light source may be passed across the photoresist layer at a constant speed of 0.5 meters per second, the light is then extinguished and returned to the starting point. The light source is then passed across the photoresist layer a second time, and the light is then extinguished and returned to the start point. This sweeping action ensures that the distinguishing mark is evenly exposed to an equal amount of source light each time the source light passes across the photoresist layer.

Preferably, the light source is approximately 300 watts and at least 200 mm in length to ensure that it fully covers the photoresist area to be exposed; the optical disc being 120 mm in diameter in this embodiment of the invention.

The invention is not restricted to the photoresist layer being exposed only twice. The number of exposure sweeps would depend upon the type of photoresist being used in the process because each type of photoresist is designed to be used with, i.e. exposed by, a light source of a particular wavelength.

When the transparent sheet is placed in contact with the photoresist layer, great care has to be taken in handling the transparent sheet in order to avoid the introduction of contaminants to the photoresist layer thereby causing physical disturbance to the photoresist layer during the development step.

One embodiment of the invention will now be provided by way of example with reference to the illustrative accompanying drawings in which.

Figure 1:
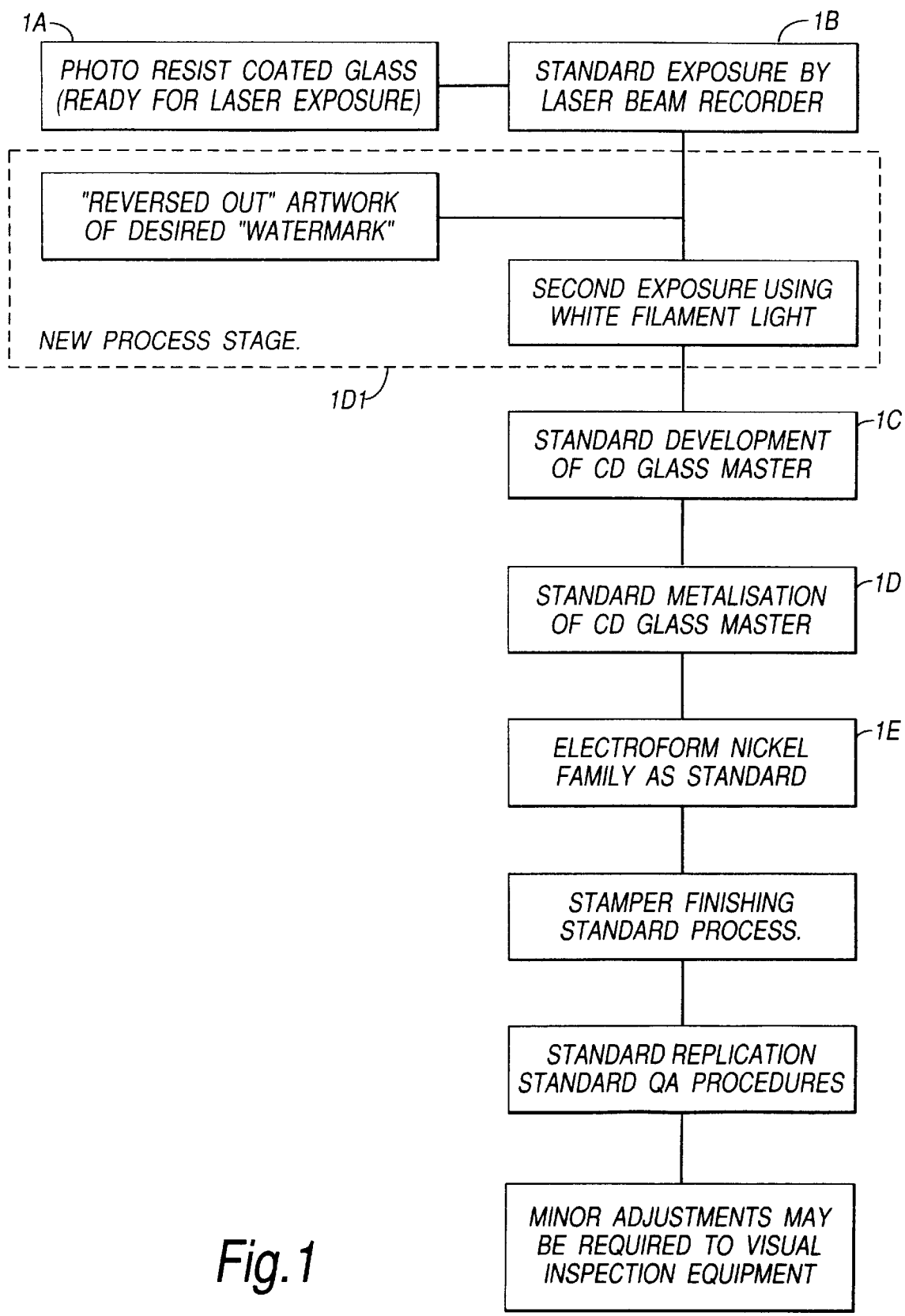
FIG. 1 is flow chart illustrating the production of an optical disc master.
Figure 2A:
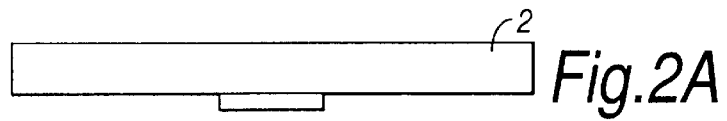
FIG. 2 is a schematic diagram illustrating some of the steps in the production of an optical disc master.
Figure 2B:
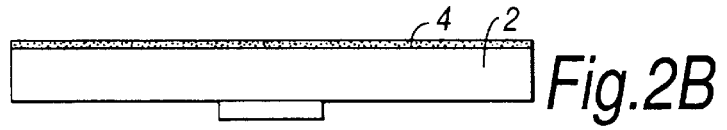

Referring to the accompanying drawings, a method of producing compact discs includes providing a glass master plate 2 as shown in FIG. 2A. The upper surface of this glass master plate 2 is prepared with an adhesion promoter 4 as shown in FIG. 2B. A photoresist layer 6 is coated on the prepared surface 4 as shown in FIG. 2C and FIG. 1A.

Figure 2C:
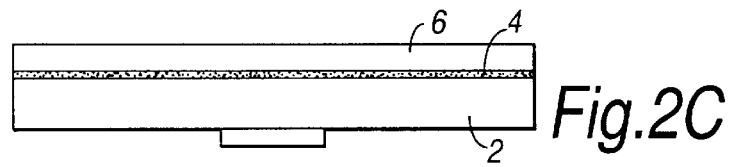
Figure 2D:
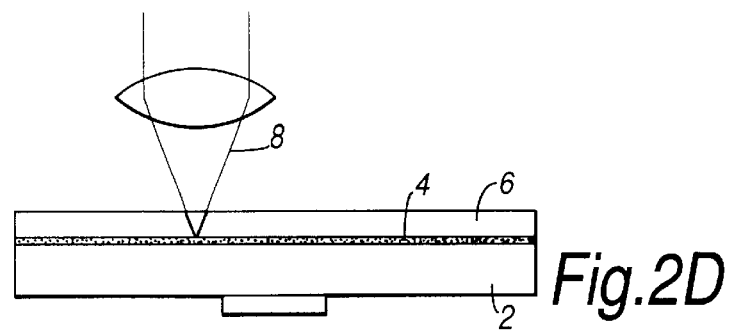
Figure 2F:
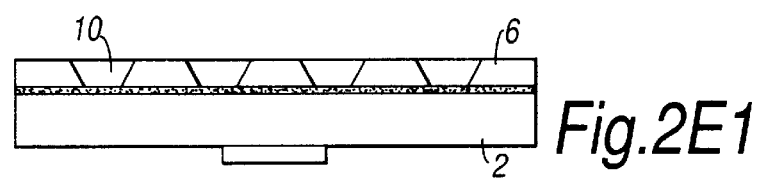
Figure 2F:
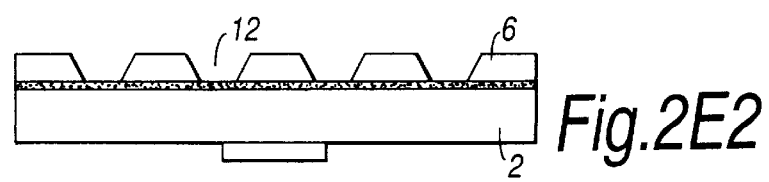
Figure 2F:
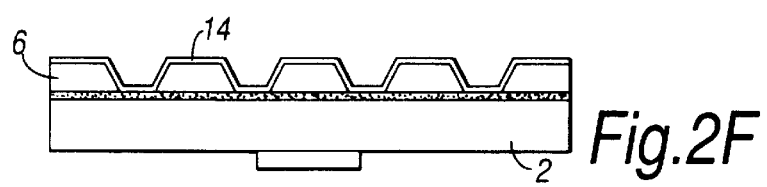

The photoresist coated glass master FIG. 2C and FIG. 1A is then exposed to a laser beam 8 which is modulated in accordance with the programme to be recorded, as shown in FIG. 2D and FIG. 1B. The glass master plate 2 with its photoresist layer is rotated about its central axis and the laser beam 8 is moved radially outwardly from the plate centre so that the exposed parts of the photoresist layer 6 are in the form of a spiral pattern. The exposure to the laser beam 8 causes the exposed pattern 10 of the photoresist layer 6 to change its chemical structure as shown in FIG. 2E1.

In a known method of producing compact discs, the next stage is to develop and wash the master so that the exposed parts of the photoresist layer 6 are washed away to form pits 12 as shown in FIG. 2E2 and FIG. 1C. A very thin layer 14 of sputtered nickel or evaporated silver is formed on the upper surface of the photoresist layer 6 as shown in FIG. 2F and FIG. 1D.

A nickel father is electroformed onto the metal layer 14, and the metal layer 14 and photoresist layer 6 are peeled off as to form an integral part of the father. The photoresist layer 6 is chemically removed from the father to leave the nickel father with the metal layer 14 containing pits providing the recorded information. An electric current is passed through a nickel solution causing particles of nickel which were previously in solution to be deposited onto the father. This deposited nickel grows in thickness over a period of time and becomes a mother. This mother has the metal layer 14 and the same pit formation 12 as the glass master in FIG. 2E2. This formation of father and the mother is referred to in FIG. 1E.

A stamper of approximately 230 mm diameter is formed from the mother in the same way as the mother is formed from the father, and a stamper of approximately 140 mm diameter is then punched from the larger diameter stamper ready for producing compact discs.

A plastic polycarbonate disc is injection moulded against the nickel stamper and a reflective metallic layer is placed on the side of the disc containing the impression of the information pits from the stamper. A protective lacquer layer is placed on the aluminium layer, and then an appropriate label is printed on the exposed surface of the lacquer layer.

The invention comprises subjecting the exposed glass master plate 2 of FIG. 2E1 to an additional exposure stage as shown in FIG. 3.

Figure 3A:
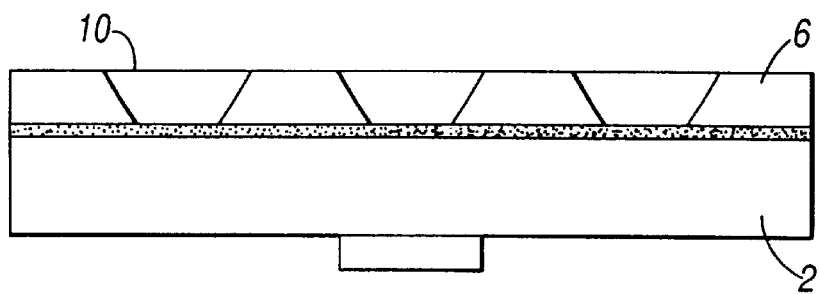
FIG. 3 is a schematic diagram illustrating the second exposure step of the invention.

FIG. 3A is the same as FIG. 2E1 and shows the exposed undeveloped master plate 2 and photoresist layer 6. This photoresist layer 6 has been exposed to the laser beam 8 and therefore contains a spiral pattern 10 of exposed photoresist material. Because the laser beam 8 has been modulated digitally to have two signal values 0 and 1 the intensity of the laser beam 8 will take up either one of these values so that the exposure depth of the photoresist layer 6 will either be 0 corresponding to the upper surface of the photoresist layer or 1 corresponding to the lower surface of the photoresist layer 6.

Referring to FIGS. 3B, 3C and FIG. 1D1, a transparent sheet 16 is placed on the upper surface of the photoresist layer 6. This transparent sheet 16 contains a distinguishing mark required to be located in the compact disc. This mark may comprise written matter, an illustration, a logo or any combination of these. White light 18 from a second light source is passed through the sheet 16 onto the photoresist layer 6 to expose the upper surface of the lands 20 of the photoresist layer 6. This second light source is of less focused intensity than the first laser light source. The exposed part of this upper surface provides a pattern 22 corresponding to the mark on the transparent sheet 16.

Figure 3B:
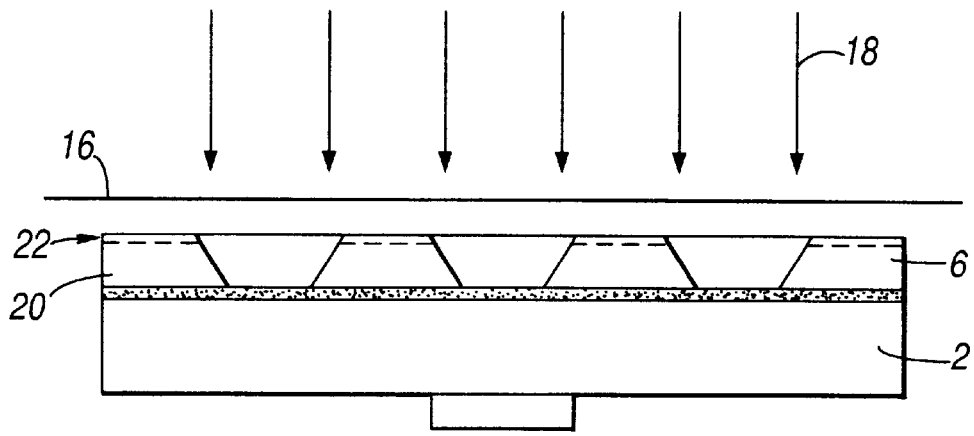

As previously mentioned, the laser beam 8 exposes either the entire depth of the photoresist layer 6 to produce a 1 signal or does not expose any part of the photoresist layer 6 to produce a 0 signal. The white light however exposes only a relatively shallow portion of the photoresist layer 6 to produce the pattern 22 as shown in FIG. 3B.

Figure 3C:
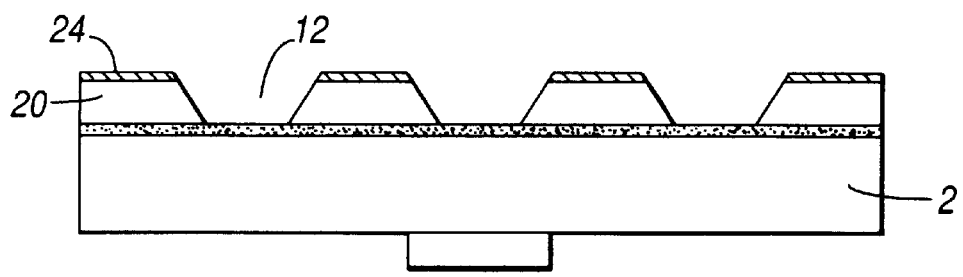

The master 2, which has been exposed to both the laser beam 8 and the white light 18 is then developed and washed as previously described and shown in FIG. 2E2 and FIG. 1C to form the pits 12 and a reproduction 24 of the distinguishing mark on the upper surfaces of the lands 20 as shown in FIG. 3C.

The developed master is then passed through all the previously mentioned manufacturing steps to provide a stamper having pits and the reproduction of the distinguishing mark upon the upper surface of the lands. In consequence, when a compact disc is injection moulded from the stamper, the reproduction of the distinguishing mark is formed on the upper surface of the lands of the disc. An ultra-violet cured lacquer layer is placed on the side of the disc containing the lands and the reproduction of the distinguishing mark thereby protecting the reproduction against damage or unwanted removal.

Preferably the photoresist layer 6 is exposed twice to the white light. The source of this white light is passed across the photoresist layer 6 at a constant speed of approximately 0.5 M per second, the light is then extinguished and the light source returned to the starting point. The light source is then passed across the photoresist layer 6 a second time, and the light source is then extinguished and returned to the start point. This sweeping action ensures that the distinguishing mark is evenly exposed to an equal amount of white light each time the white light passes across the photoresist layer 6.

Preferably the second light source is approximately 300 watts and at least 200 mm in length to ensure that it fully covers the photoresist area to be exposed; the optical disc being 120 mm in diameter.

It is to be emphasised that the invention is not restricted to the use of white light from the second light source.

What is claimed is:

1. A method of manufacturing an optical disc master comprising preparing the surface of a glass master plate, applying a photoresist layer to this prepared surface, subjecting the photoresist layer to a first exposure of a modulated laser beam to produce an exposed first pattern corresponding to the modulation information of the laser beam, locating a distinguishing mark in the path of light from a white light source, directing light from the white light source onto the previously exposed surface of the photoresist layer after locating the distinguishing mark to locate an exposed second pattern on the previously exposed surface corresponding to said distinguishing mark.

2. A method as claimed in claim 1 in which the distinguishing mark is contained in a transparent sheet located in the path of light from the second light source.

3. A method as claimed in claim 2 in which the transparent sheet is placed in contact with the surface of the photoresist layer receiving the light from the second light source.

4. A method as claimed in any claim 3 in which the said light is passed across the photoresist layer.

5. A method as claimed in claim 4 in which the said light is passed across the photoresist layer at approximately 0.5 meters per second.

6. A method as claimed in claim 4 in which the said light is passed a plurality of times across the photoresist layer.

7. A method as claimed in claim 1 in which the said second light source has a power of approximately 300 watts.

8. A method as claimed in claim 1 in which the said second light source is tubular.

9. An optical disc master manufactured by the method as claimed in claim 1.

10. An optical disc made from an optical disc master manufactured by the method as claimed in claim 1.

11. An optical disc master manufactured by the method as claimed in claim 2.

12. An optical disc made from an optical disc master manufactured by the method as claimed in claim 2.

13. An optical disc master manufactured by the method as claimed in claim 3.

14. An optical disc made from an optical disc master manufactured by the method as claimed in claim 3.

15. An optical disc master manufactured by the method as claimed in claim 4.

16. An optical disc made from an optical disc master manufactured by the method as claimed in claim 4.

17. An optical disc master manufactured by the method as claimed in claim 6.

18. An optical disc made from an optical disc master manufactured by the method as claimed in claim 6.

19. A method of manufacturing an optical disc master comprising preparing the surface of a glass master plate, applying a photoresist layer to this prepared surface, subjecting the photoresist layer to a first exposure of a modulated laser beam to produce an exposed first pattern corresponding to the modulation information of the laser beam, locating a distinguishing mark in the path of light from a white light source, directing light from the white light source onto the previously exposed surface of the photoresist layer after locating the distinguishing mark to locate an exposed second pattern on the previously exposed surface corresponding to said distinguishing mark including placing a transparent sheet with the distinguishing mark in contact with the surface of the photoresist layer and passing a tubular, approximately 300 watt white light across the photoresist layer at approximately 0.5 meters per second.

\* \* \* \* \*

UNITED STATES PATENT AND TRADEMARK OFFICE
CERTIFICATE OF CORRECTION

PATENT NO. : 6,190,748 B1  Page 1 of 1
DATED : February 20, 2001
INVENTOR(S) : Xavier et al.

It is certified that error appears in the above-identified patent and that said Letters Patent is hereby corrected as shown below:

Claim 4,
Delete "any".

Signed and Sealed this

Twenty-fifth Day of December, 2001

Attest:

Attesting Officer

JAMES E. ROGAN
Director of the United States Patent and Trademark Office